United States Patent [19]
Burke

[11] Patent Number: 5,793,070
[45] Date of Patent: Aug. 11, 1998

[54] REDUCTION OF TRAPPING EFFECTS IN CHARGE TRANSFER DEVICES

[75] Inventor: Barry E. Burke, Lexington, Mass.

[73] Assignee: Massachusetts Institute of Technology, Cambridge, Mass.

[21] Appl. No.: 637,290

[22] Filed: Apr. 24, 1996

[51] Int. Cl.$^6$ .................... H01L 27/148; H01L 29/768
[52] U.S. Cl. .................... 257/219; 257/221; 257/224; 257/248; 257/249
[58] Field of Search .................... 257/219, 221, 257/224, 243, 245, 246, 248–250

[56] References Cited

U.S. PATENT DOCUMENTS

| | | | |
|---|---|---|---|
| 3,728,590 | 4/1973 | Kim et al. | 257/246 |
| 3,932,882 | 1/1976 | Berger | 257/245 |
| 4,067,001 | 1/1978 | Hoffman | 257/249 |
| 4,089,023 | 5/1978 | Losehand | 257/246 |
| 4,156,247 | 5/1979 | Hartman et al. | 257/245 |
| 4,185,292 | 1/1980 | Nelson | 257/243 |
| 4,319,261 | 3/1982 | Kub | 257/245 |
| 4,590,506 | 5/1986 | Esser | 257/245 |
| 4,667,213 | 5/1987 | Kosonocky | 257/219 |
| 4,675,714 | 6/1987 | Higgins | 257/219 |
| 4,809,048 | 2/1989 | Kimata et al. | 257/219 |
| 4,901,125 | 2/1990 | Yamada | 257/243 |
| 4,992,842 | 2/1991 | Yang et al. . | |
| 5,065,203 | 11/1991 | Yang et al. | 257/221 |
| 5,105,248 | 4/1992 | Burke et al. . | |
| 5,451,802 | 9/1995 | Komobuchi et al. | 257/250 |
| 5,578,511 | 11/1996 | Son | 257/248 |

OTHER PUBLICATIONS

IEEE Transactions on Electron Devices, vol. ED–21, No. 11, Nov. 1974, pp. 701–712, "The Effects of Bulk Traps on the Performance of Bulk Channel Charge–Coupled Devices" by Arm M. Mohsen and Michael F. Tompsett.

*Primary Examiner*—Gene M. Munson
*Attorney, Agent, or Firm*—Samuels, Gauthier, Stevens & Reppert

[57] ABSTRACT

A charge transfer device including a semiconductor substrate, a gate electrode provided in association with the substrate, the gate electrode having a corresponding channel region through which charge is propagated, the channel region having a predetermined potential; and means associated with the channel region for reducing charge trapping and recombination effects. In one aspect of the present invention, the reducing means includes a potential pocket defined within the channel region having a greater potential than the predetermined potential of said channel region. The potential pocket has a width dimension which is less than the corresponding width dimension of the channel region. The potential pocket is positioned in the center of the gate electrode, and is positioned so as to be aligned with a front edge of the gate electrode. The potential pocket is formed by an ion implantation into the semiconductor substrate, a region of an insulating layer having a thickness which differs from the thickness of the remainder of the insulating layer positioned between the gate electrode and the substrate, a second gate electrode positioned adjacent the first gate electrode, or a lightly or undoped second region of a resistive layer disposed adjacent the gate electrode.

23 Claims, 10 Drawing Sheets

REDUCTION OF TRAPPING EFFECTS IN CHARGE TRANSFER DEVICES

This invention was made with government support under Contract Number F19628-90-C-0002 awarded by the U.S. Air Force. The government has certain rights in the invention.

BACKGROUND OF THE INVENTION

The invention relates to the reduction of trapping effects in charge transfer devices.

Many applications of charge-coupled devices (CCDs), such as low-light-level imaging and soft x-ray spectroscopy, depend critically on performance at low signal levels. Among the challenges of CCD operation at signal levels down to a few electrons are trapping (or recombination) effects which degrade charge-transfer efficiency (CTE). This problem is compounded by the trend toward large devices, whose sizes are now being pushed to fill an entire 100-mm wafer. Transferring charge packets over a few centimeters of silicon with minimal loss requires extremely low concentrations of traps from impurities and defects. Even when devices can be manufactured with near perfect CTE, there are environments, such as space or the presence of radioactive material, where the radiation will generate trap defects in a CCD.

There are a variety of techniques for minimizing trapping effects in CCDs. Gettering techniques and clean wafer processing are used to ensure that wafers do not become contaminated with impurities that form traps. In some cases it is possible to select an operating temperature for a device at which the trapping effects are minimized, as has been demonstrated for the case of traps induced by energetic proton bombardment. Shielding is to some extent possible in space or a nuclear environment, but at the cost of weight and volume.

However, there is great interest in developing techniques or device design that leads to the mitigation of trapping effects. One conventional approach for reducing trapping effects is the use of potential troughs as described in U.S. Pat. No. 4,185,292 entitled "Potential Troughs For Charge Transfer Devices", issued to Nelson, and U.S. Pat. No. 4,667,213 entitled "Charge-Coupled Device Channel Structure", issued to Kosonocky, both of which are incorporated herein by reference.

The basis for these techniques involves restricting the size of a charge packet so as to minimize the number of traps that a charge packet can encounter. FIG. 1A illustrates in cross section a buried-channel CCD 10. The direction of charge transfer is perpendicular to the page, and a cross section of a charge packet 12 in a channel 13 defined under a gate 14 can be seen. The packet 12 is confined on the left and right by channel stops 16, and encounters traps 17 within the channel. FIG. 1B illustrates the associated potential profile for the carriers in the channel and shows that charge 19 tends to spread out laterally across the channel. By adding an ion implantation 18 in the form of a narrow stripe down the center of the channel, a potential trough 20 is created, as shown in FIGS. 2A and 2B. The carriers collect in the trough until the trough is filled. By confining the carriers to the trough, the possibility of the carriers encountering the traps is minimized. Obviously, this is effective until the trough is filled, and so is useful only for small charge levels. However, the charge losses to traps are, on a percentage basis, highest for the smallest packets, and therefore it is this small signal regime in which it is most important to preserve good CTE.

Another approach for minimizing trapping effects has been described in U.S. Pat. No. 5,105,248 entitled "Spatial Light Modulator Using Charge-Coupled Device With Quantum Wells", issued to Burke et al., incorporated herein by reference. The described technique uses a similar philosophy, but applied in the dimension normal to the CCD channel. The approach involves the use of a so-called "quantum-well" CCD channel in which the charge packet is flattened to a thickness of about 10 nm, compared with 100 nm or more in conventional devices. Again, this reduction in charge-packet volume minimizes the interaction between carriers and traps.

It is therefore clear that it is possible to reduce the volume of a charge packet in two of the three available dimensions, but it would be desirable to utilize the third dimension. This remaining dimension is the direction of charge transfer, and a simplistic approach would be to reduce this dimension by making the CCD stages short. However, this approach is certainly not acceptable in many cases, such as an image sensor where the pixel sizes must be determined by the application. Accordingly, the conventional wisdom is that in general no further improvement is possible along the lines of charge-packet confinement. It is an object of the present invention to obviate the conventional wisdom, and to show a new technique can be brought to bear in the dimension along the charge-transfer path.

It is therefore an object of the present invention to provide an improved charge transfer device which enhances the reduction of trapping effects.

SUMMARY OF THE INVENTION

The present invention provides a charge transfer device including a semiconductor substrate, a gate electrode provided in association with the substrate, the gate electrode having a corresponding channel region through which charge is propagated, the channel region having a predetermined potential; and means associated with the channel region for reducing charge trapping and recombination effects. In one aspect of the present invention, the reducing means includes a potential pocket defined within the channel region having a greater potential than the predetermined potential of said channel region. The potential pocket has a width dimension which is less than the corresponding width dimension of the channel region. The potential pocket is positioned in the center of the gate electrode, and is positioned so as to be aligned with a front edge of the gate electrode. The potential pocket is formed by an ion implantation into the semiconductor substrate, a region of an insulating layer having a thickness which differs from the thickness of the remainder of the insulating layer positioned between the gate electrode and the substrate, a second gate electrode positioned adjacent the first gate electrode, or a lightly or undoped second region of a resistive layer disposed adjacent the gate electrode.

DETAILED DESCRIPTION OF THE ILLUSTRATED EMBODIMENTS

To aid in understanding the concept of the present invention, it is important to briefly review a result from the standard theory for trapping effects, and found in all standard texts on semiconductor physics. A trap level can be characterized by a capture cross section σ, which has the dimensions of area. If a trap is situated in a CCD well with a concentration n of carriers, then the mean time $\tau_c$ for this trap to capture a carrier is $\tau_c = 1/n\sigma v_{th}$, where $v_{th} \approx 26 \cdot 10^7$ cm/s is the thermal velocity of the carriers. Typically, the carrier densities in a CCD well are $n = 10^{14}$ to $10^{16}$ and capture cross sections are roughly $\sigma \approx 10^{-14}$ to $10^{-17}$ cm$^2$ depending on the trap species, so that the capture times may range from $\tau_c \approx 26 \cdot 10^{-4}$ to $10^{-9}$ s. These times are short in comparison to the dwell times of packets in a CCD well in many situations. In broadcast television CCD imagers, for example, the carriers will accumulate for about $10^{-2}$ S in a pixel before being clocked out, while during readout the dwell times are reduced to $10^{-5}$ to $10^{-7}$ s. Thus, in many situations the traps have sufficient time to capture carriers from a charge packet.

Figure 1A:
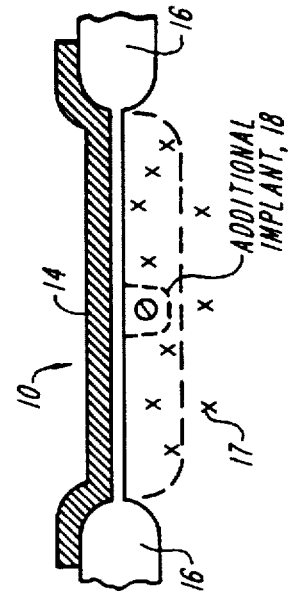
FIGS. 1A and 1B show a cross section of a conventional CCD and a corresponding potential well diagram.
Figure 1B:
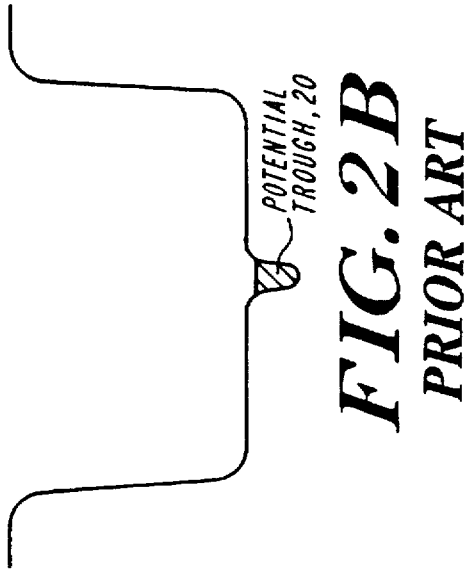
Figure 2A:
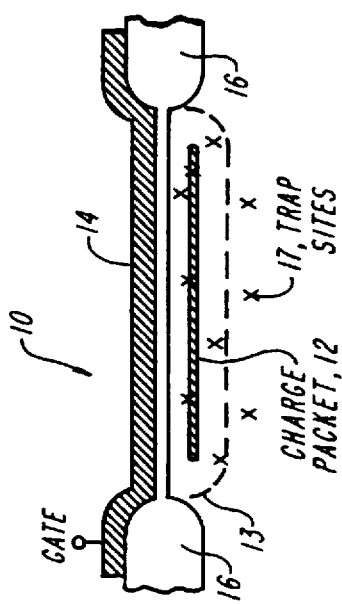
FIGS. 2A and 2B show a cross section of a CCD with a trough implant and a corresponding potential well diagram.
Figure 2B:
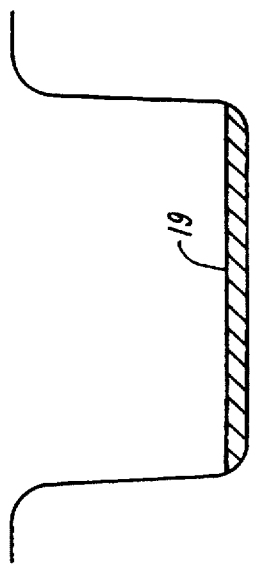
Figure 3A:
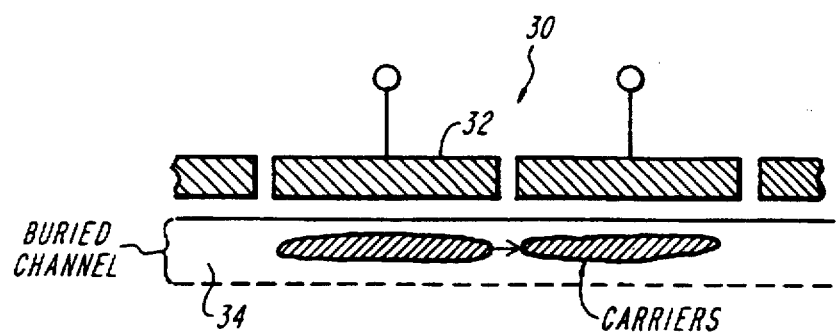
FIGS. 3A and 3B show a cross section of a conventional CCD and a corresponding potential well diagram with traps.
Figure 3B:
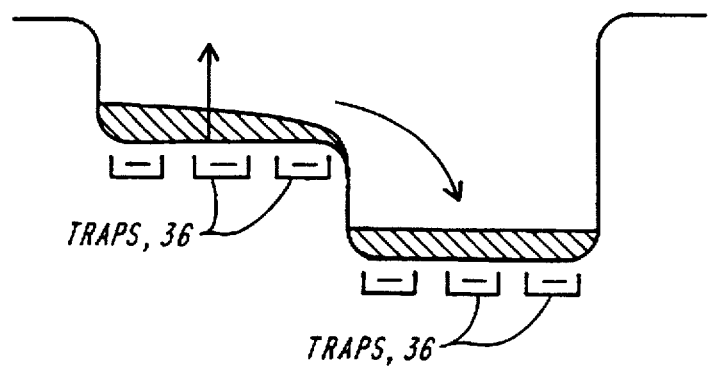

FIGS. 3A and 3B show a cross-section of a conventional CCD 30 having gate electrodes 32 defining a buried channel 34, and a corresponding potential well diagram with the direction of charge transfer from left to right on the page. A buried-channel device is shown for exemplary purposes, but the results are applicable to surface-channel devices as well. The potential diagram indicates three traps 36 under each gate, and the charge (cross-hatched area) has resided in the wells long enough to allow all the traps to capture electrons (for p-channel devices these would obviously be holes).

Figure 4A:
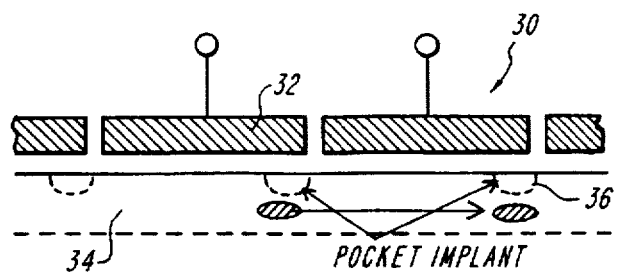
FIGS. 4A and 4B show a cross section of a CCD with a pocket implant in accordance with the present invention and a corresponding potential well diagram with traps.
Figure 4B:
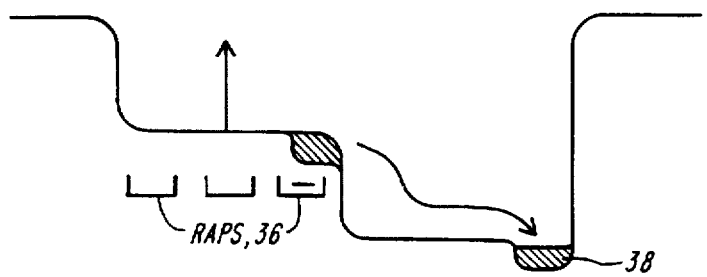
Figure 5:
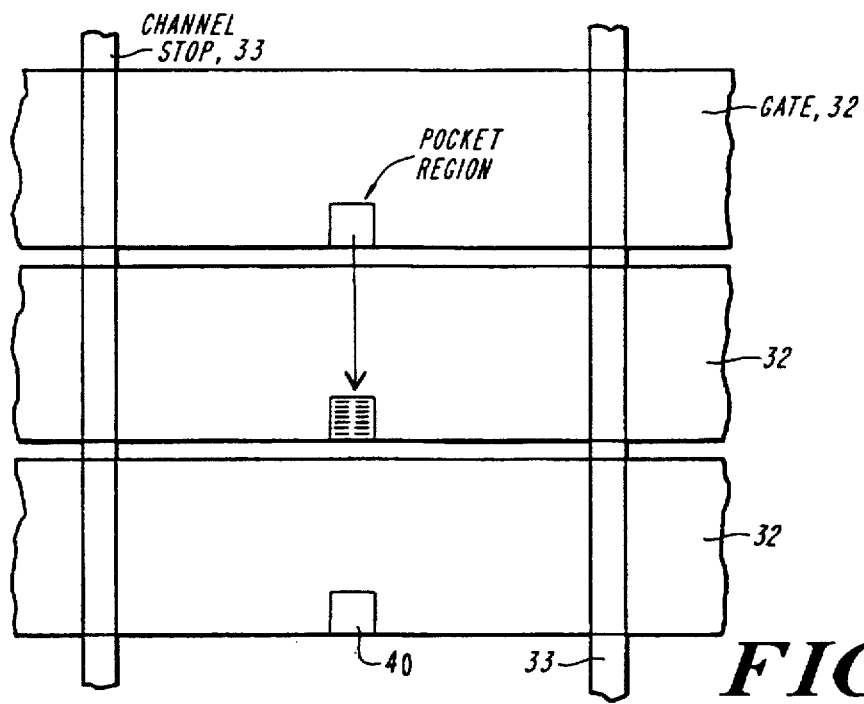
FIG. 5 shows a top plan view of the CCD of FIG. 4A.

In accordance with the present invention and as shown in FIGS. 4A and 4B, the CCD 30 is modified with the addition of an ion implant pocket 40 into the silicon substrate below the right edge of each gate 32. This implant is chosen to create a deeper potential well, or pocket 38, so that carriers can collect there. For maximum effectiveness, the pocket should be made as narrow as possible, both in the direction of charge transfer and in the dimension normal to the figure. An exemplary optimum configuration is illustrated in FIG. 5. As shown, the CCD has a plurality of gates 32 having channel stops 33 defining a transfer channel. The pocket implants 36 are positioned adjacent the front edges of each gate, and are dimensioned so as to be substantially less in width and length in comparison to the corresponding width and length of the gates.

Of course, the size of the pocket involves a tradeoff between minimizing trapping effects and maximizing well capacity, as discussed in more detail hereinafter. Consider now the case of a small charge packet which can be contained within the pocket. As this pocket is transferred from a sending well to a receiving well, the carriers will move rapidly through the receiving well and into the pocket. The time required for this transit is typically very small, on the order of a few nanoseconds in most cases, and thus the probability of carrier capture is very small for all but the very fastest traps. The carriers have thus avoided being trapped by sites outside the pockets.

One of the fundamentally important points about the pocket implant in accordance with the present invention is that there must be precise alignment between the edge of the pocket and the gate that abuts it. Even a small misalignment can result in undesirable barriers or pockets that would impede carrier flow from one well to the next. Thus, it is essential to arrive at a process that results in automatic alignment, or self alignment, of the pocket to the associated gates.

An exemplary method of fabricating the pockets of the present invention is illustrated in FIGS. 6A–6C and 7. The figures show the essential details by which this technique can be applied to a three-phase, triple-poly process such as is conventionally practiced or to a four-phase, two-poly process. One of the limitations of this process as currently practiced is that there is no obvious way to place a self-aligned pocket beneath the first polysilicon gate electrodes, and therefore this procedure gives the user only ⅔ of the potential benefit of the pocket for a three-phase process and ½ the benefit for a four-phase process.

Figure 6A:
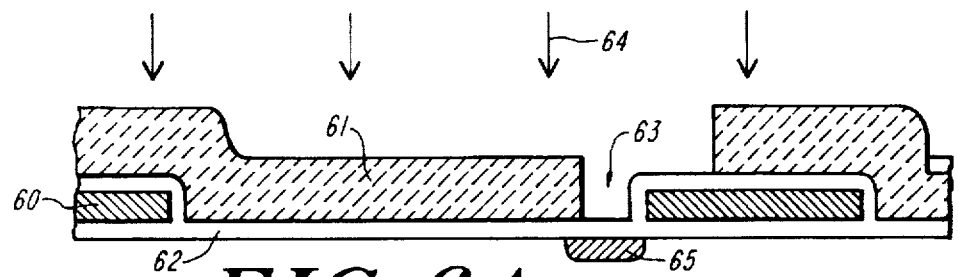
FIGS. 6A–6C show a step-wise fabrication process of a CCD with the pocket implant of the present invention.

Accordingly, the description begins after the first poly gates 60 with gate insulator layer 62 are already defined as shown in FIG. 6A. The next step consists of depositing photoresist 61 on the wafer, exposing a mask pattern 63 and developing the resist as can also be seen in FIG. 7. The desired pattern is an opening that overlaps the left edge of the first polysilicon electrodes. An ion implant 64 is performed at an energy that is sufficient to enable the implant species to penetrate the gate insulator but not the sum of the gate insulator, the first polysilicon and its oxide coat. In this way the implant that is deposited in the silicon substrate creates a pocket 65 whose right edge is self-registered to the left edge of the first polysilicon gate irrespective of small misalignments of the photomask with respect to the poly gates.

For the implant species, one can choose either a donor, such as phosphorus or arsenic, or an acceptor, such as boron. The choice depends on whether the device is n-channel (electrons are the carriers) or p-channel (holes are the carriers). For the n-channel case, a donor implant creates a deeper well (pocket), while an acceptor implant creates a pocket in a p-channel device.

Figure 6B:
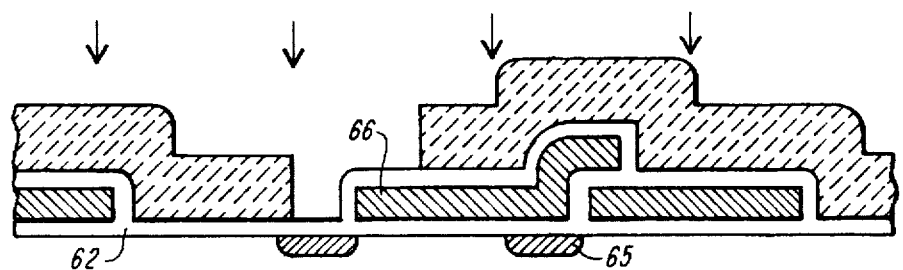
Figure 6C:
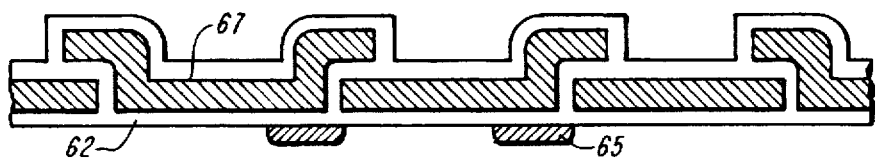
Figure 7:
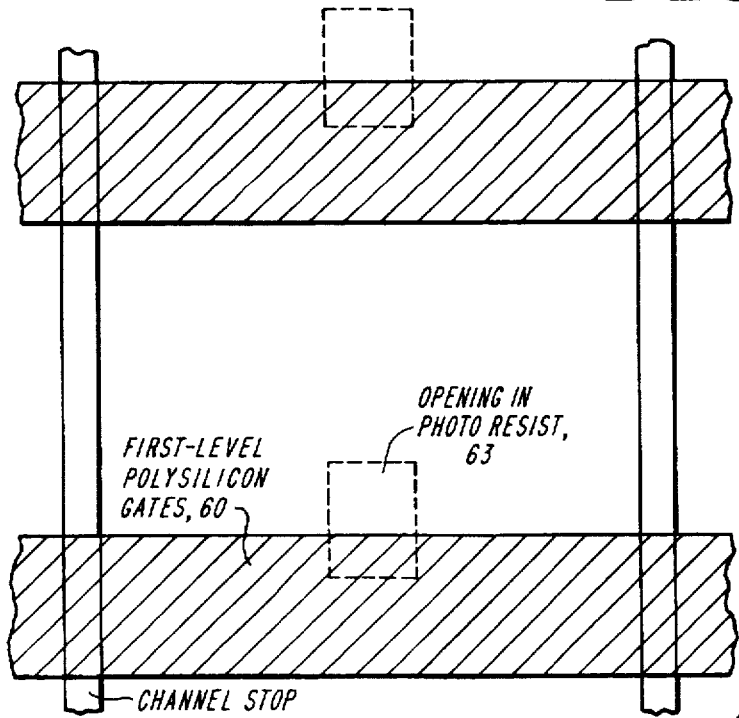
FIG. 7 shows a top plan view of the CCD in FIG. 6A.

After the pocket implant, a second polysilicon layer is deposited and patterned to form the second level of gates 66 as shown in FIG. 6B. At this point, the same procedure is applied to form pockets that will reside under third polysilicon gates 67 and be self-aligned to the left edge of the second poly gates.

Figure 8A:
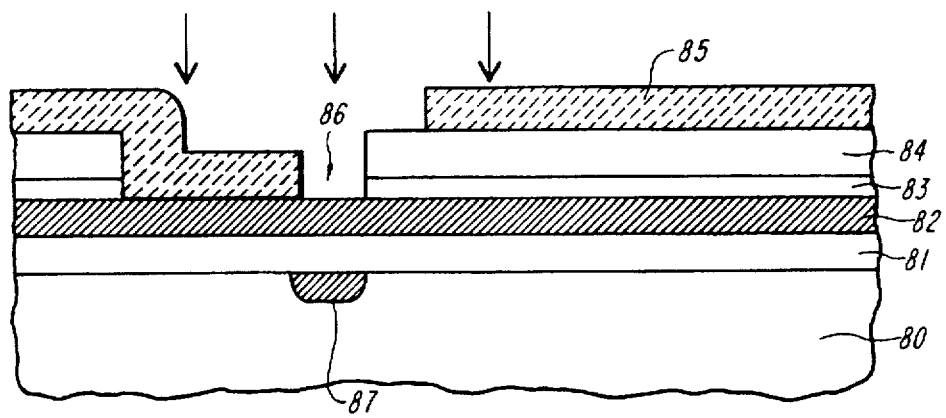
FIGS. 8A–C show an alternative step-wise fabrication process of a CCD with the pocket implant of the present invention.
Figure 8B:
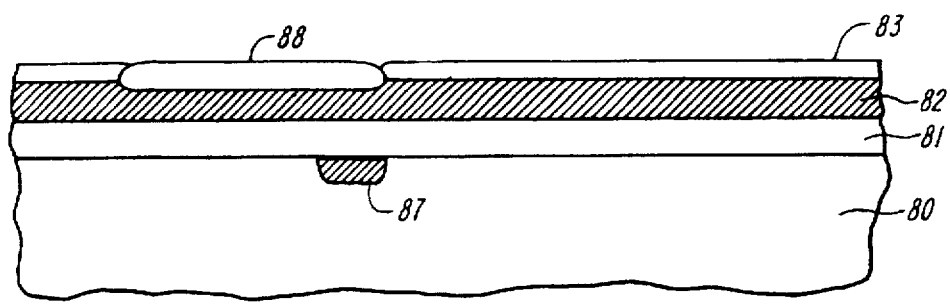
Figure 8C:
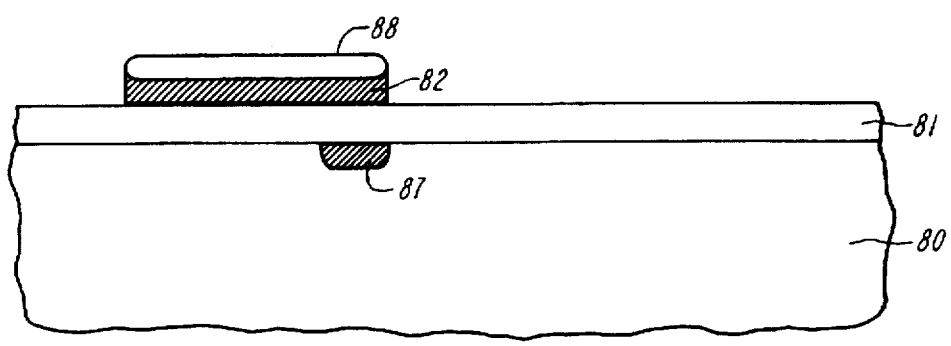

The standard three-phase, triple-poly process is limited to two pockets, but there is a way to place self-aligned pockets under all three phases (the following applies also to two-phase, four-poly processes). FIGS. 8A–8C illustrate the basic features of an exemplary process for achieving the foregoing structure. The process follows that of the conventional poly-gate process until just after deposition of the first polysilicon so that a structure is formed having a silicon substrate 80, a gate insulator layer 81 and a polysilicon layer 82.

At this point, a film of silicon nitride 83 followed by a film of silicon dioxide 84 is deposited on the polysilicon. The oxide/nitride layer is patterned and etched to expose what will become later the first polysilicon electrodes. Next, photoresist 85 is deposited and patterned to expose the region 86 where the pocket implant 87 is to be placed. In FIG. 8B the photoresist has been stripped away, followed by a selective etch that removes the silicon dioxide. The wafer is then oxidized, but since silicon nitride is a barrier to the oxidizing species, only the polysilicon that is to become the first electrode level is oxidized with a silicon dioxide layer 88. This oxide becomes an etch mask for the final step. In the last step, shown in FIG. 8C, the silicon nitride and polysilicon outside the level-one gate electrodes are removed by an etch that attacks silicon nitride and polysilicon more rapidly than silicon dioxide.

Figure 9:
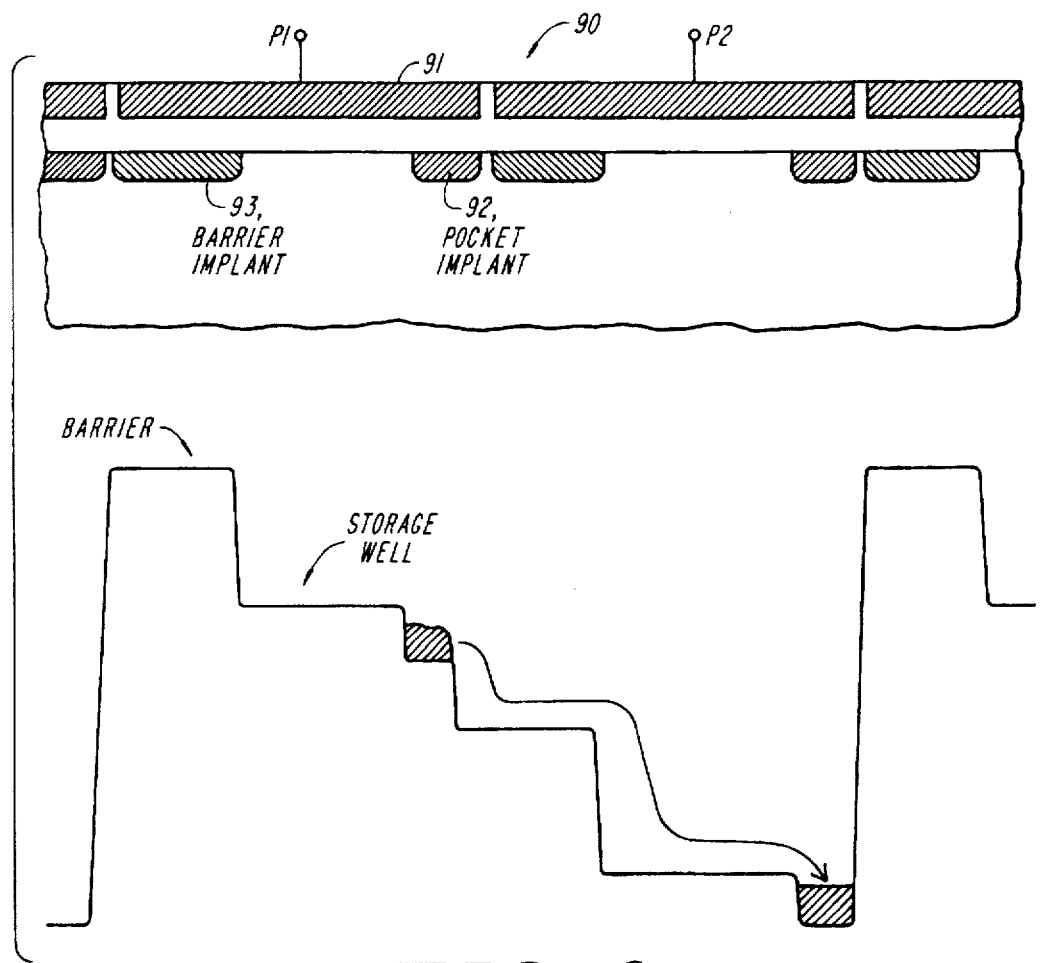
FIG. 9 shows an alternative embodiment of the present invention with a CCD having a pocket implant and a barrier implant associated with each gate.

Two-phase CCDs can also make use of this technique in a straightforward manner, as illustrated in FIG. 9. The device 90 shown is a two-phase, two-poly device, having gates 91 with the addition of a pocket implant 92 as described in the previous figures. A two-phase structure is attractive because it requires only two clock voltages whose timing is less critical than that of the three-or four-phase devices. In the device, a barrier implant 93 is placed under the left edge of both poly layers, and for an n-channel device this implant would be an acceptor. This barrier forces charge to the right into the storage well portion. The pocket implant at the right edge of each gate would then be a donor species.

Figure 10:
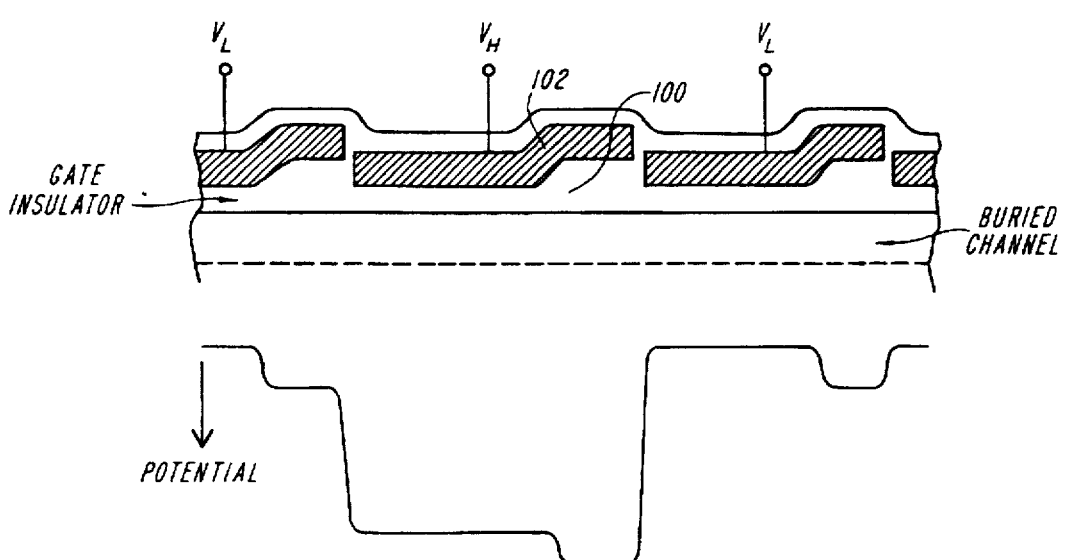
FIG. 10 shows an alternative embodiment of the present invention where varying oxide thicknesses create the pocket potential.

The focus to this point has been on ion implantation as the preferred means of creating pockets, but there are at least two other methods that might be used for this purpose. One such alternative technique, illustrated in FIG. 10, uses a region 100 of thicker oxide (for buried-channel devices) or thinner oxide (for surface-channel devices) under the gate electrode 102 to create the pocket.

Figure 11A:
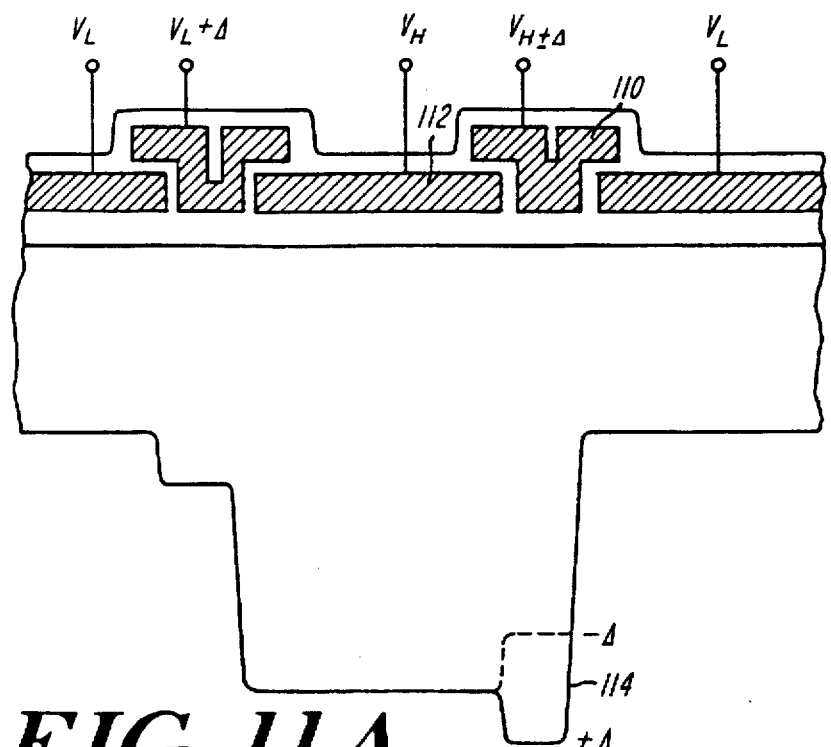
FIGS. 11A and 11B show a cross section and top plan view of an alternative embodiment of the present invention where an additional gate electrode is used to define the pocket potential.
Figure 11B:
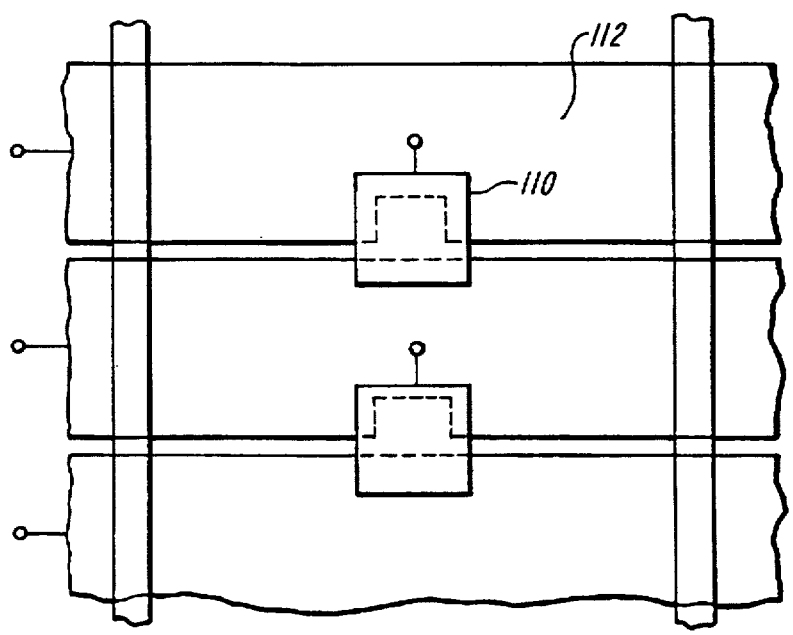

Another approach, as shown in FIGS. 11A and 11B, uses a separate gate 110 in conjunction with the conventional gate 112 for creating the pocket 114 in the potential well. The bias on this gate will determine the potential depth of the pocket. Again, this approach is less appealing from a fabrication point of view than ion implantation, although it has more operational flexibility than the latter. For example, the pocket depth can be varied or even set to zero or a negative value (by varying the voltage offset Δ) in order to allow charge transfer in the reverse direction, in contrast to the implanted pocket which forces undirectionality on the charge transfer and has fixed depth.

Figure 12A:
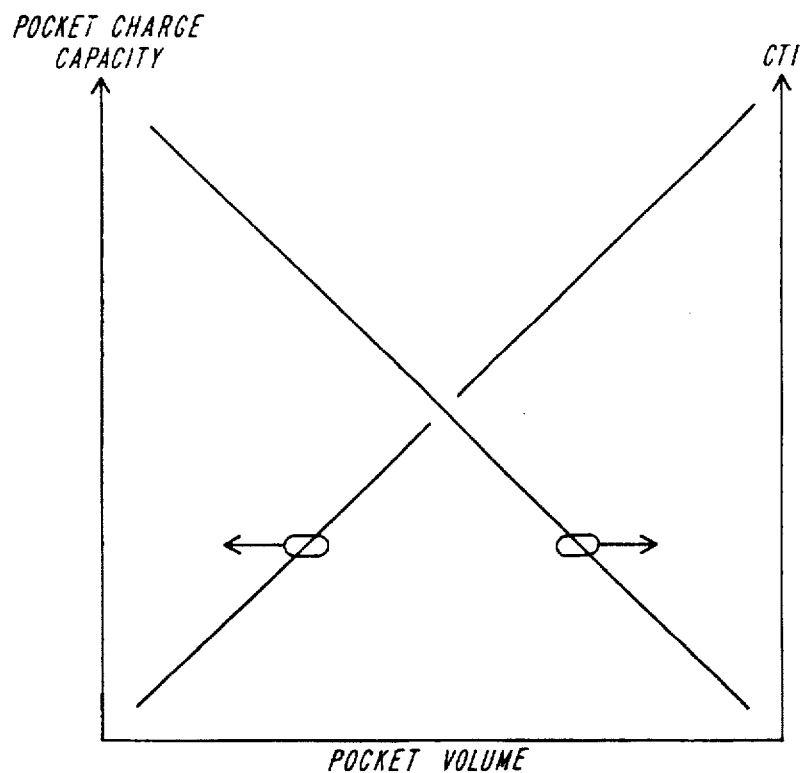
FIG. 12A shows a graph of the qualitative relationship between minimizing trapping effects and maximizing the well capacity of the pocket.
Figure 12B:
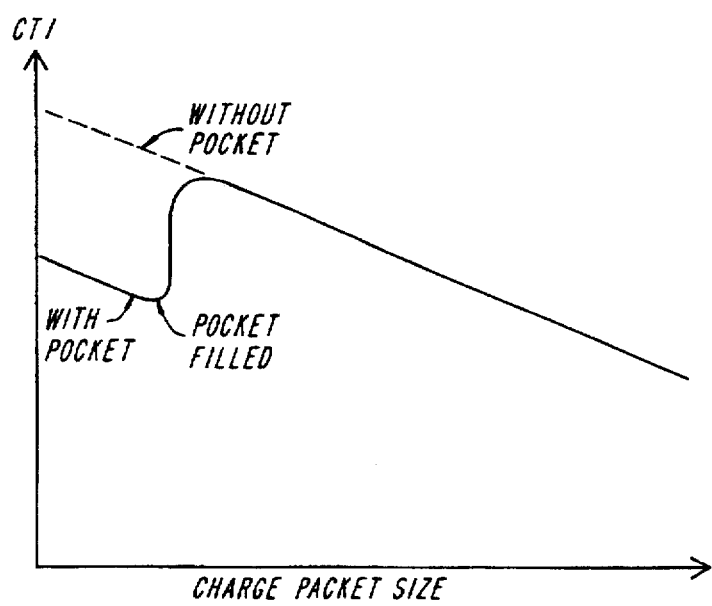
FIG. 12B shows a graph of the qualitative relationship between charge-packet size and CTI in accordance with the present invention.

Heretofore reference was made to a tradeoff between minimizing trapping effects and maximizing the well capacity of the pocket. FIG. 12A illustrates qualitatively the relationship between these factors. A small pocket minimizes trapping effects (thereby maximizing charge transfer inefficiency (CTI), but the charge capacity is minimized. A large pocket reverses this situation. FIG. 12B illustrates qualitatively the relationship between charge-packet size and CTI, showing how small packets suffer a disproportionately larger loss than large ones and how the pocket helps alleviate this situation. Recall that when a packet that does not fit entirely into the pocket is clocked through the device the portion that does not fit into the pocket is subject to the full trapping effects.

Figure 13A:
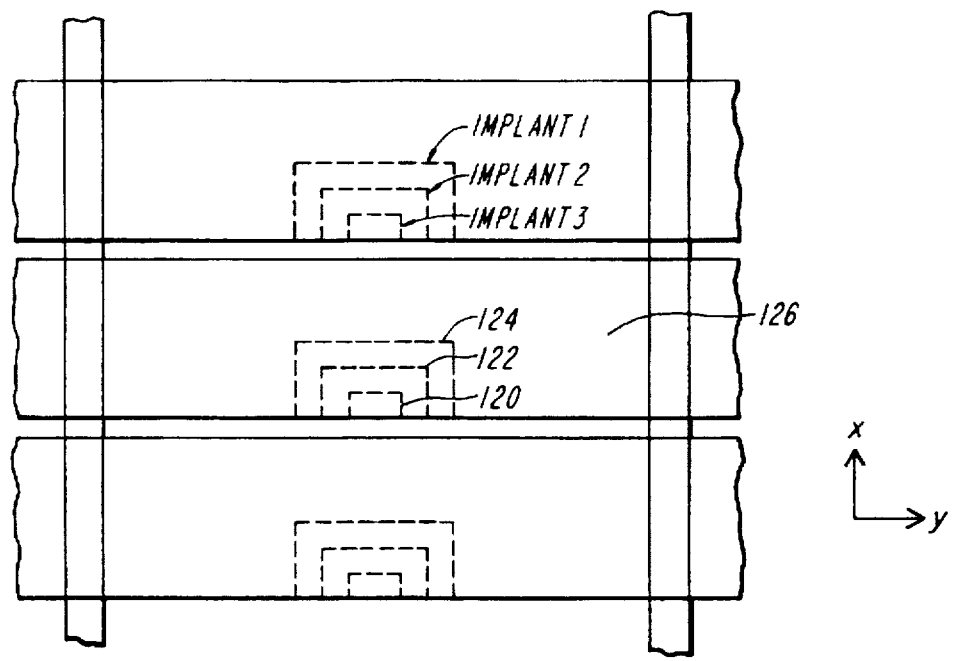
FIGS. 13A and 13B show a top plan view of a CCD with a plurality of pocket implants in accordance with the present invention and a corresponding potential well diagram.
Figure 13B:
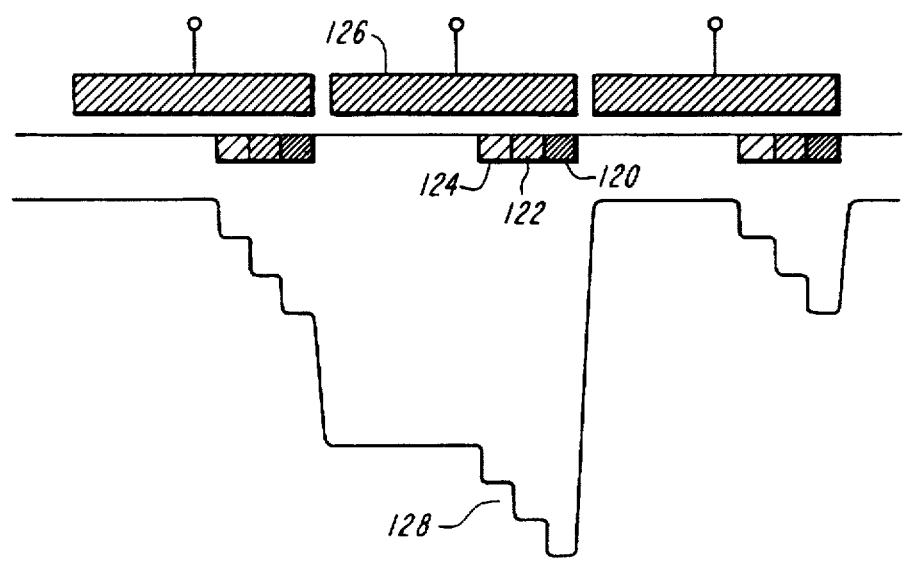
Figure 14:
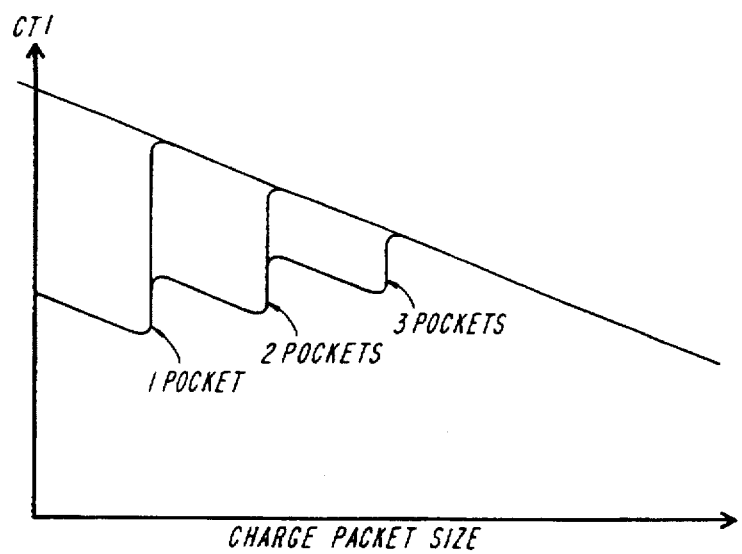
FIG. 14 shows a graph of the qualitative relationship of CTI and charge packet size with reference to the CCD of FIG. 13A.

FIGS. 13A and 13B illustrate a device configuration which serves to flatten the CTE vs. packet size curve that is illustrated in FIG. 12B. A multiplicity of pockets 120, 122, 124 of progressively larger size are used in conjunction with a conventional gate 126. The size can be enlarged in both dimensions as illustrated in this figure or just in the x- or y-dimensions (widened or elongated). FIG. 13B shows that the implants are superimposed on each other and create a staircase potential 128 along a line running down the center of the channel. FIG. 14 illustrates qualitatively the expected performance of such a device.

Figure 15A:
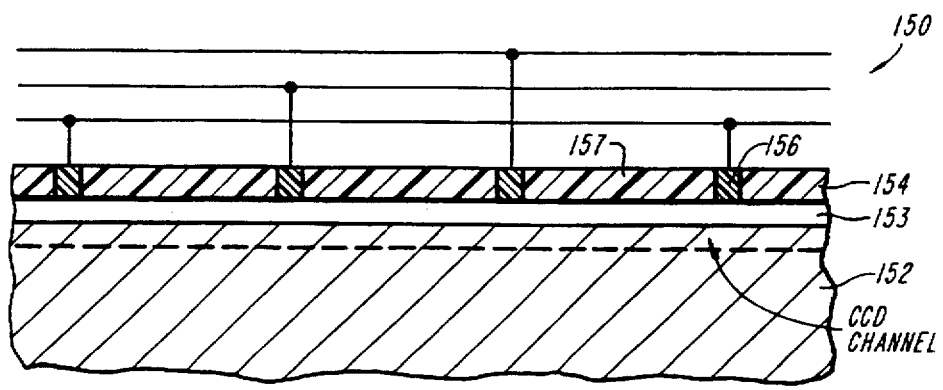
FIGS. 15A and 15B show a cross section of a resistive gate CCD in accordance with the present invention and a corresponding potential well diagram.
Figure 15B:
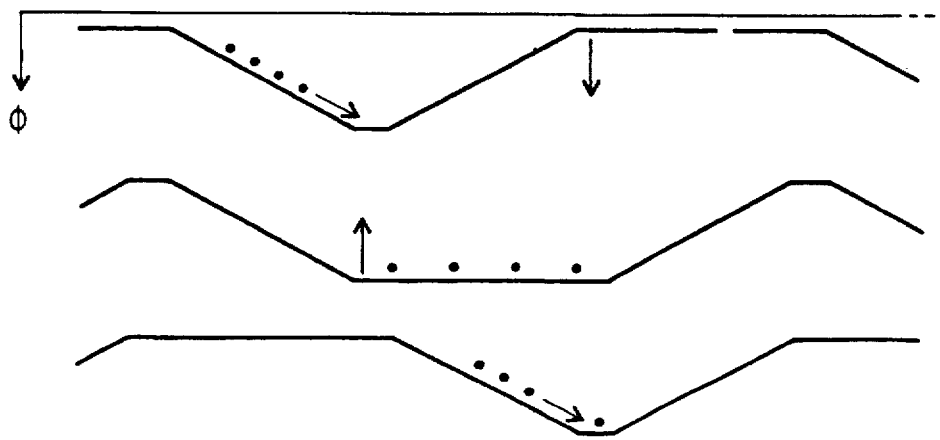

Another alternative embodiment of the present invention involves a CCD structure which uses the same physical principles to achieve the reduced trapping. The structure relies on a CCD fabrication process using a resistive film between the gate electrodes, and is herein referred to as a resistive-gate CCD or RGCCD. FIG. 15A illustrates a CCD 150 having the conventional semiconductor substrate 152 with an insulating layer 153 (e.g. $SiO_2$) deposited or grown on the substrate. In the next step, a layer of highly resistive material 154, such as undoped polysilicon, is deposited on the insulator surface. FIG. 15B shows the corresponding potential well diagram.

Selected regions 156 of the polysilicon are heavily doped and form the gates. The undoped areas 157 may be lightly doped to adjust their resistance for purposes of minimizing power dissipation or improving the speed of the device. The undoped regions provide a well-defined voltage gradient between electrodes so that a uniform drift field for the carriers is maintained. In this way the heavily doped gate electrodes can be relatively far apart, which minimizes the problem of gate-to-gate shorts found in conventional overlapping gate CCDs. Alternatively, the regions 156 and 157 can be configured from differing materials. For example, the gates can be made from metal with a resistive film deposited thereon.

The interest here lies in the inherent resistance of the RGCCD to trapping effects. In the structure 150, the carriers are stored at potential minima directly beneath the gate electrodes. At all other times they drift from one electrode well to the next along the sloping potential under the resistive regions. When the voltage gradient is moderately high, the carriers can travel at velocities that will minimize trapping. An RGCCD with relatively narrow doped gates and wide resistive regions is therefore especially favorable for minimizing trapping. For CCDs made on non-silicon semiconductors such as GaAs or SiC, which are notorious for high trap densities, such a structure would seem especially useful.

It will be appreciated by those of skill in the art that alternate embodiments of the illustrated embodiment are within the scope of the invention. For example, with reference to FIGS. 4B and 6–10 and the associated description, there is described a pocket in accordance with the present invention which is created by ion implantation into the semiconductor region designated as the pocket. An alternative configuration of the invention includes an implanting method in which regions other than the pocket region are implanted with opposite type species. In other words, instead of a donor implant being provided into the pocket region, an acceptor implant would be provided into the non-pocket regions.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A charge transfer device comprising:

a semiconductor substrate;

a gate electrode provided in association with said substrate, said gate electrode having a corresponding channel region through which charge is propagated, said channel region having a predetermined potential; and means associated with said channel region for reducing charge trapping and recombination effects, said reducing means comprises a potential pocket defined within said channel region having a greater potential than said predetermined potential of said channel region, said potential pocket having a width dimension which is less than the corresponding width dimension of said channel region, said potential pocket spans less than the entire length of said gate electrode in the direction of charge transfer.

2. The device of claim 1, wherein said potential pocket is positioned in the center of said gate electrode.

3. The device of claim 2, wherein said potential pocket has a length which is substantially less than the length of said gate electrode in the direction of charge transfer.

4. The device of claim 3, wherein said potential pocket is positioned so as to be aligned with a front edge of said gate electrode.

5. The device of claim 1, wherein said potential pocket is formed by an ion implantation into said semiconductor substrate.

6. The device of claim 1 further comprising a potential barrier defined within said channel region having a lesser potential than said predetermined potential of said channel region, said potential barrier formed by an ion implantation into said semiconductor substrate.

7. The device of claim 6, wherein said potential pocket and potential barrier have respective lengths which are substantially less than the length of said gate electrode in the direction of charge transfer, said potential barrier being positioned in alignment with one edge of said gate electrode, and said potential pocket being positioned in alignment with the opposite edge of said gate electrode.

8. The device of claim 1 further comprising an insulating layer positioned between said substrate and said gate electrode.

9. The device of claim 8, wherein said potential pocket is formed by a region of said insulating layer having a thickness which differs from the thickness of the remainder of said insulating layer positioned between said gate electrode and said substrate.

10. The device of claim 1, wherein said potential pocket is formed by a second gate electrode positioned adjacent the first gate electrode.

11. The device of claim 10, wherein the potential associated with said potential pocket is varied by varying the potential applied to said second gate electrode.

12. The device of claim 1, wherein said reducing means comprises a plurality of adjacent potential pockets defined within said channel region, each of said potential pockets having a greater potential than said predetermined potential of said channel region.

13. The device of claim 12, wherein each of said plurality of adjacent potential pockets has progressively differing potentials.

14. A charge-coupled device which operates to reduce charge trapping and recombination effects, comprising:

a semiconductor substrate;

a gate electrode provided in association with said substrate, said gate electrode having a corresponding channel region through which charge is propagated, said channel region having a predetermined potential;

a potential pocket defined within said channel region having a greater potential than said predetermined potential of said channel region; and a potential barrier defined within said channel region having a lesser potential than said Predetermined potential of said channel region, wherein said potential pocket has a width dimension which is less than the corresponding width dimension of said channel region, and said potential pocket and potential barrier have respective lengths which are less than the length of said gate electrode in the direction of charge transfer.

15. The device of claim 14, wherein said potential pocket is formed by an ion implantation into said semiconductor substrate.

16. The device of claim 14, wherein said potential barrier is formed by an ion implantation into said semiconductor substrate.

17. The device of claim 16, wherein said potential barrier is positioned in alignment with one edge of said gate electrode, and said potential pocket is positioned in alignment with the opposite edge of said gate electrode.

18. The device of claim 14 further comprising an insulating layer positioned between said substrate and said gate electrode.

19. The device of claim 18, wherein said potential pocket is formed by a region of said insulating layer having a thickness which differs from the thickness of the remainder of said insulating layer positioned between said gate electrode and said substrate.

20. The device of claim 14, wherein said potential pocket is formed by a second gate electrode positioned adjacent the first gate electrode.

21. The device of claim 20, wherein the potential associated with said potential pocket is varied by varying the potential applied to said second gate electrode.

22. The device of claim 14 further comprising a plurality of adjacent potential pockets defined within said channel region, each of said potential pockets having a greater potential than said predetermined potential of said channel region.

23. The device of claim 22, wherein each of said plurality of adjacent potential pockets has progressively differing potentials.

* * * * *